United States Patent [19]

Hamashima et al.

[11] Patent Number: 4,744,663
[45] Date of Patent: May 17, 1988

[54] PATTERN POSITION DETECTION APPARATUS USING LASER BEAM

[75] Inventors: Muneki Hamashima; Kinya Kato, both of Tokyo, Japan

[73] Assignee: Nippon Kogaku K.K., Tokyo, Japan

[21] Appl. No.: 808,932

[22] Filed: Dec. 13, 1985

[30] Foreign Application Priority Data

Dec. 14, 1984 [JP] Japan ............................ 59-264037
Jun. 28, 1985 [JP] Japan ............................ 60-140430

[51] Int. Cl.⁴ ............................................ G01B 11/00
[52] U.S. Cl. ................... 356/375; 250/461.1; 356/73; 356/237
[58] Field of Search ........... 356/375, 400, 73, 237; 250/561, 458.1, 459.1, 461.1, 461.2

[56] References Cited

U.S. PATENT DOCUMENTS

| | | | |
|---|---|---|---|
| 4,087,685 | 5/1978 | Froot | 250/461.1 |
| 4,284,897 | 8/1981 | Sawamura et al. | 250/461.2 |
| 4,441,124 | 4/1984 | Heebner et al. | 356/237 |

FOREIGN PATENT DOCUMENTS

| | | | |
|---|---|---|---|
| 0149849 | 7/1985 | European Pat. Off. | 356/237 |
| 0046543 | 4/1981 | Japan | 250/461.1 |

Primary Examiner—F. L. Evans
Attorney, Agent, or Firm—Michael N. Meller

[57] ABSTRACT

A pattern position detecting apparatus using a laser beam which is used for the recognition of an edge position, line width, etc., of a circuit pattern on a semiconductor wafer used in the fabrication of semiconductor devices. The apparatus includes an optical system for condensing a short-wave energy beam into a tiny spot and projecting it onto a sample, means for moving the sample and the spot relative to each other, first detecting means for receiving at least one of a reflection from a pattern and a scattering from a pattern edge, second detecting means for detecting a luminescence emitted from a pattern portion hit by the spot, and means for determining the position of the pattern in accordance with the detection information from the first and second detecting means and the scanning information of the spot.

7 Claims, 8 Drawing Sheets

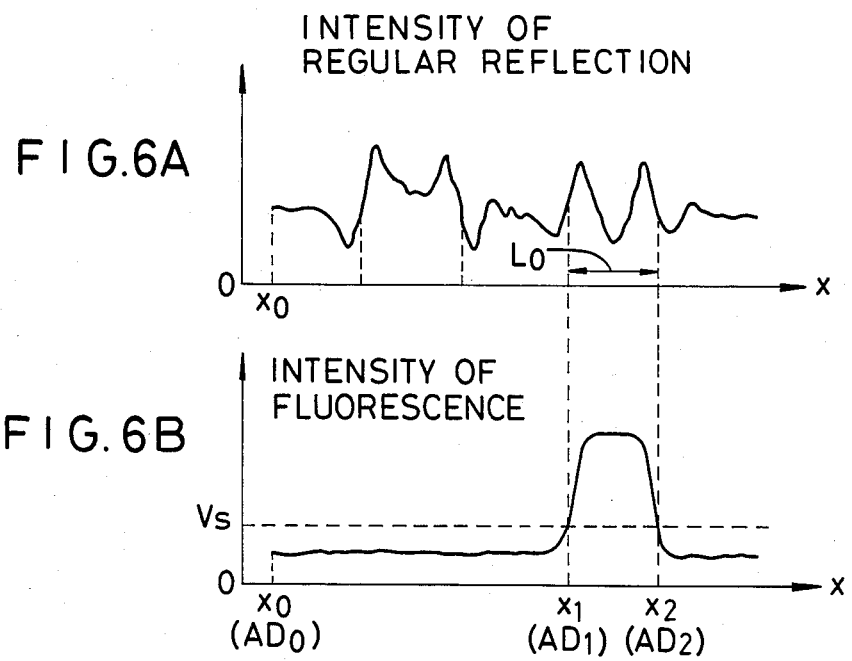
FIG.6A  INTENSITY OF REGULAR REFLECTION
FIG.6B  INTENSITY OF FLUORESCENCE
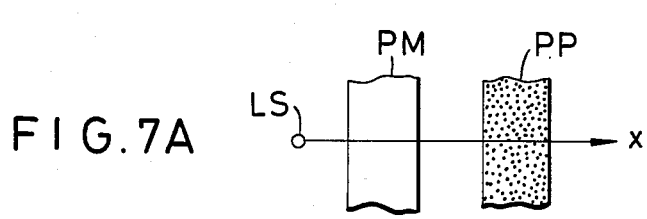
FIG.7A
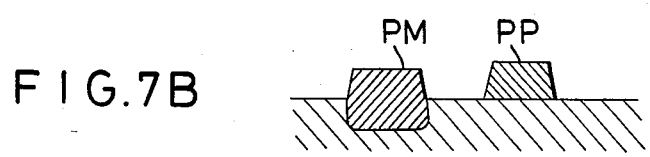
FIG.7B

PATTERN POSITION DETECTION APPARATUS USING LASER BEAM

BACKGROUND OF THE INVENTION

1. Field of the Invention

The present invention relates to a pattern position detecting apparatus and more particularly to a pattern position detecting apparatus using a laser beam which is well suited for the recognition of the edge positions, line width, etc. of a photoresist pattern used in the fabrication process of semiconductor devices.

2. Description of the Prior Art

In the fabrication of semiconductor devices, such as ICs or LSIs, by the use of a semiconductor wafer, the wafer undergoes various treatments in the course of the fabrication process and particularly in order to fully ensure the desired characteristics it is important to accurately control the line width, dimensions, etc. of a circuit pattern or the like during the process. For this purpose, there has existed a need for an apparatus capable of automatically measuring the line width, dimensions, etc. of such pattern with a high degree of accuracy.

Various apparatus have been in actual use for measuring the dimensions, etc., of patterns on wafers and these known apparatus are mainly of the type in which the pattern image observed through an optical microscope is picked up by a television camera (ITV) and the pattern dimensions are measured in accordance with the resulting video signal. Of these conventional apparatus, those which are capable of automatic measurement suffer the following disadvantages.

(1) As the fineness of the pattern on a wafer increases, it becomes more difficult to make the measurment with greater accuracy due to the limitations imposed by the resolution of an optical microscope. This is particularly evident in the measurement of very important photoresist patterns.

(2) When measuring or detecting the pattern in the photoresist, if the kind of the base material for the photoresist layer is aluminum, polysilicon or the like, there is the danger of a situation arising in which due to the inherent material characteristic which is referred to as granulation, noise corresponding to the granulation is contained in a video signal resulting from the pattern, thus making it difficult to make the measurement.

(3) There are cases where it is difficult to make the simultaneous measurement of patterns of different kinds of materials which are present on the wafer. This may, for example, occur in cases where a relative positional deviation between a photoresist pattern formed by the exposure and other etching pattern is measured for the purpose of evaluating the alignment accuracy of an exposure apparatus or the like.

(4) When measuring the line width of a photoresist pattern, depending on the type of the photoresist, the layer thickness or the absolute dimension of the line width, the offset amount of the measured dimension value is varied, thus making it difficult to obtain an accurate dimension value.

The foregoing problems are more or less encountered in any apparatus adapted for measuring the dimensions of fine patterns and this amounts to a serious disadvantage in the case of the apparatus capable of the automatic measurement. Of course, this is not limited to the measurement of pattern dimensions and similar deficiencies are encountered in the simple detection of the small stepped edge positions of a pattern (e.g., an alignment mark for registration purposes).

SUMMARY OF THE INVENTION

It is an object of the present invention to provide a pattern position detecting apparatus which is high in resolution and accuracy or an automatic dimension measuring apparatus employing such pattern position detecting apparatus.

It is another object of the invention to provide a pattern position detecting apparatus which projects a spot of a very small area and high energy onto the pattern on a sample and utilizes the spot as a measuring probe.

In accordance with one aspect of the invention, there is provided a pattern position detecting apparatus including an optical system for condensing a short-wave energy beam into a tiny spot of beam and projecting it onto a sample containing a geometrical pattern; scanning means for moving the sample and the spot relative to each other; first detecting means arranged so as to receive at least one of the regular reflection from the pattern and the scattered light from the edge of the pattern; second detecting means arranged to receive a luminescence emitted from a portion of the pattern struck by the energy spot; and means for determining the position of the pattern in accordance with detection information from the first detecting means, detecting information from the second detecting means and information relating to the relative scanning position of the spot.

The luminescence detected by the second detecting means is either fluorescence or phosphorescence and particularly the fluorescence is used in the preferred embodiments of the invention.

In accordance with another aspect of the invention, there is provided pattern position detecting apparatus designed such that the properties of the photoresist are not changed even if granulation takes place at the edge positions of a pattern and slight variations of the small portion of the pattern are averaged, thereby satisfactorily detecting the pattern position in a stable manner with a high degree of reproducibility.

In other words, in addition to the scanning means for moving the sample and the spot of energy beam relative to each other, a shift means is provided to shift the scanning position of the scanning means and also an error detecting means is provided to detect whether the detecting operation of the pattern position determining means has been effected correctly without any error, whereby when an error is detected by the error detecting means the shift means is brought into operation to shift the scanning position, thereby averaging only those data measured correctly.

BRIEF DESCRIPTION OF THE DRAWINGS

FIGS. 6A and 6B are diagrams showing respectively signal waveforms of the regular reflection and fluorescence.

FIG. 7A is a plan view showing examples of patterns.

FIG. 7B is a side sectional view of FIG. 7A.

DESCRIPTION OF THE PREFERRED EMBODIMENTS

Figure 1:
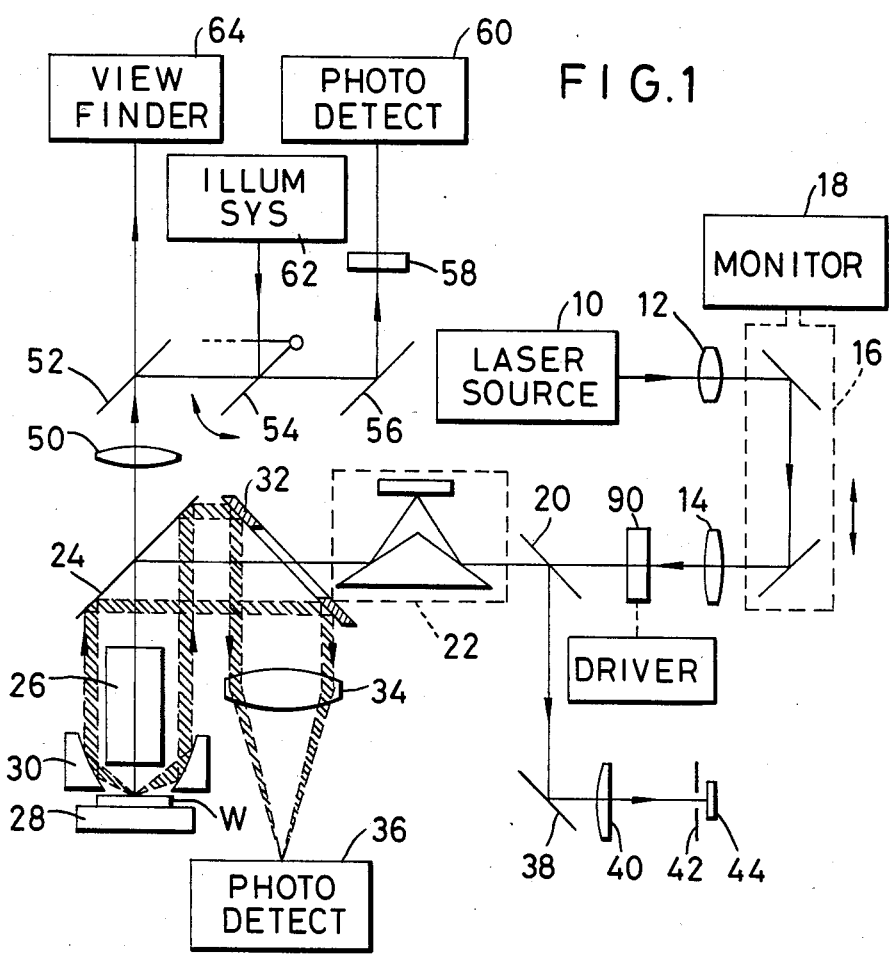
FIG. 1 is a schematic side view showing the construction of an optical section of an apparatus according to a first embodiment of the invention.

FIG. 1 shows the schematic optical construction of an apparatus according to a first embodiment of the invention.

A laser light source 10, forming an excitation light source for the production of fluorescence, produces a short-wave laser beam (coherent light beam). The diameter of the laser beam is increased through lenses 12 and 14 functioning as beam expanders. Arranged between the lenses 12 and 14 is a scanner 16 including a pair of mirrors which are movable as a unit for causing the laser beam to make a one-dimensional scanning movement. The scanner 16 is adapted to parallel shift the optical axis of the laser beam without changing the length of its optical path. A scanning movement monitor 18 comprising a laser interferometer, linear encoder or the like reads in the amount of movement of the scanner 16. The substantially collimated laser beam expanded through the beam expanders is passed through a parallel plane glass 90 and a beam splitter 20 and after passing through an image rotator 22 the light beam is reflected by a dichroic mirror 24 to fall on an objective lens 26. The dichroic mirror 24 has such a spectrum characteristic that the laser beam is reflected and other light of longer wavelengths is transmitted.

The incident laser beam to the objective lens 26 is condensed so that it is focussed as a tiny spot of beam onto a wafer W mounted on a sample carrier 28. The laser beam spot scans one-dimensionally over the wafer W in response to the movement of the scanner 16. Then, as the beam spot crosses a stepped portion of small irregularities or a so-called pattern edge, scattered light is emitted from the edge. The scattered light does not practically return to the objective lens 26 since its greater part is produced at angles greater than the solid angle determined by the numerical aperture of the objective lens 26.

As a result, these scattered rays are condensed by a spherical mirror 30 arranged in the form of a ring around the objective lens 26 so that they are returned outside the periphery of the objective lens 26 aliong the optical axis to the dichroic mirror 24. The scattered light reflected by the dichroic mirror 24 is further reflected by a donut mirror 32 and then it is condensed through a lens 34 onto a photodetector 36 comprising a photomultiplier or the like. The combination of the spherical mirror 30, the donut mirror 32 and the lens 34 corresponds to the dark-field optical system of the microscope. It is to be noted that where the scattered light intensity from the pattern is sufficiently high, the dark-field optical system may be eliminated by arranging a solid-state sensor in the form of a ring around the objective lens 26 for detection purposes.

On the other hand, the regular reflection from the wafer W is reflected by the dichroic mirror 24, passed through the image rotator 22, reflected by the beam splitter 20, reflected perpendicularly by a mirror 38 and condensed by a lens 40. An aperture 42 is arranged at the condensing (focussing) position of the reflection by the lens 40 and a detector 44 comprising a silicon photodiode (SPD) is arranged at the back of the aperture 42. The photodetector 44 generates a photoelectric signal corresponding to the light quantity of the regular reflection.

Then, if the wafer W contains a pattern formed in the photoresist layer, the pattern is excited by the short-wave laser beam to emit fluorescence or phosphorescence. The fluorescence is generally a visible light having a wavelength of 500 to 700 nm and it is longer in wavelength than the laser beam. As a result, after passing through the objective lens 26, the fluorescence from the pattern is passed through the dichroic mirror 24 and through a lens 50, reflected by a beam splitter 52, and reflected by a mirror 56 and then it is directed to a photodetector 60 comprising a photomultiplier or the like through a filter 58 which cuts off the light rays in the wavelength range of the laser beam. The directional mirror 54 is adapted so that it is withdrawn from the light path between the beam splitter 52 and the mirror 56 during the detection of the fluorescence. Then, when the directional mirror 54 is inserted at angle of 45° in the light path as shown in FIG. 1, the visible illuminating light from an illuminating system 62 is reflected by beamsplitter 52, passes through the lens 50, the dichroic mirror 24 and the objective lens 26, and illuminates the observation area on the wafer W. In this condition, the light from the illuminating system 62 is prevented from impinging on the photodetector 60.

Also, the visible light emitted from the wafter W is directed to a view finder 64 via the lens 50 and the beam splitter 52, thus permitting a visual inspection of the observing area on the wafer W.

As described hereinabove, the present embodiment is so designed that the various patterns formed on the wafer W are detected by simultaneously taking three kinds of light information including the scattered light from the edge of the pattern, the reflection from the pattern and the fluorescence or phosphorescence from the pattern. As a result, by using these three kinds of light information and the scanning position information of the beam spot, the desired edge detection, pattern position detection and line width and dimension measurement of the different patterns such as the photoresist pattern and the polysilicon pattern are performed in a diversified manner.

It is to be noted that the laser light source for fluorescent detecting purposes may comprise a He-Cd laser having a wavelength of 325 or 442 nm or an Ar laser having a wavelength of 488 nm or the like.

While, in addition to the photoresist, other materials such as PSG (phosphor glass) and polyimide exhibit fluorescence when irradiated by the laser beam during the processing of the wafer, it is safe to consider that usually the pattern requiring the line width measurement is only the photoresist pattern. Although there are materials other than PSG and polyimide which emit fluorescent light, it is assumed that the present embodiment concerns the measurement of the photoresist pattern.

The parallel plane glass 90 between the lens 14 and the beam splitter 20 is provided for the purpose of shifting the scanning line of the laser beam spot on the wafer W.

Figure 2:
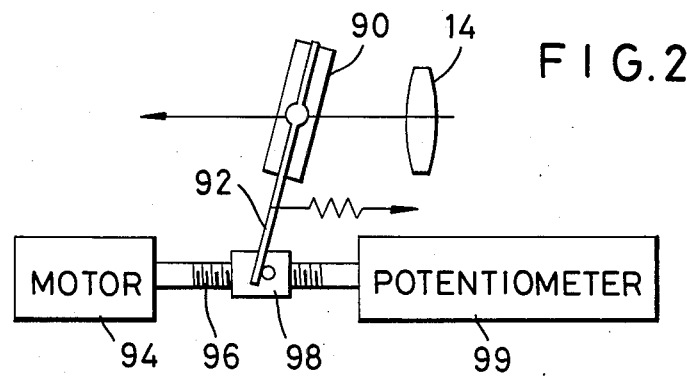
FIG. 2 is a plan view showing the driver for the parallel plane glass.

As shown in FIG. 2, the parallel plane glass 90 is supported by an arm member 92 rotatable about an axis which is parallel to the paper plane and perpendicular to the optical axis and is oscillated by a driver including a pulse motor 94, a screw 96 turned by the motor 94 and a nut 98 movable according to the pitch of the screw 96. The oscillatory movement of the parallel plane glass 90 varies its angle with respect to the incident laser beam and thus the optical path of the laser beam is shifted. As a result, the laser beam spot scans the wafer W in a two-dimensional manner in response to both the scanner 16 and the parallel plane glass 90.

The amount of shift of the laser beam corresponds to the amount of turn of the screw 96, which is detected by a potentiometer 99.

Figure 3:
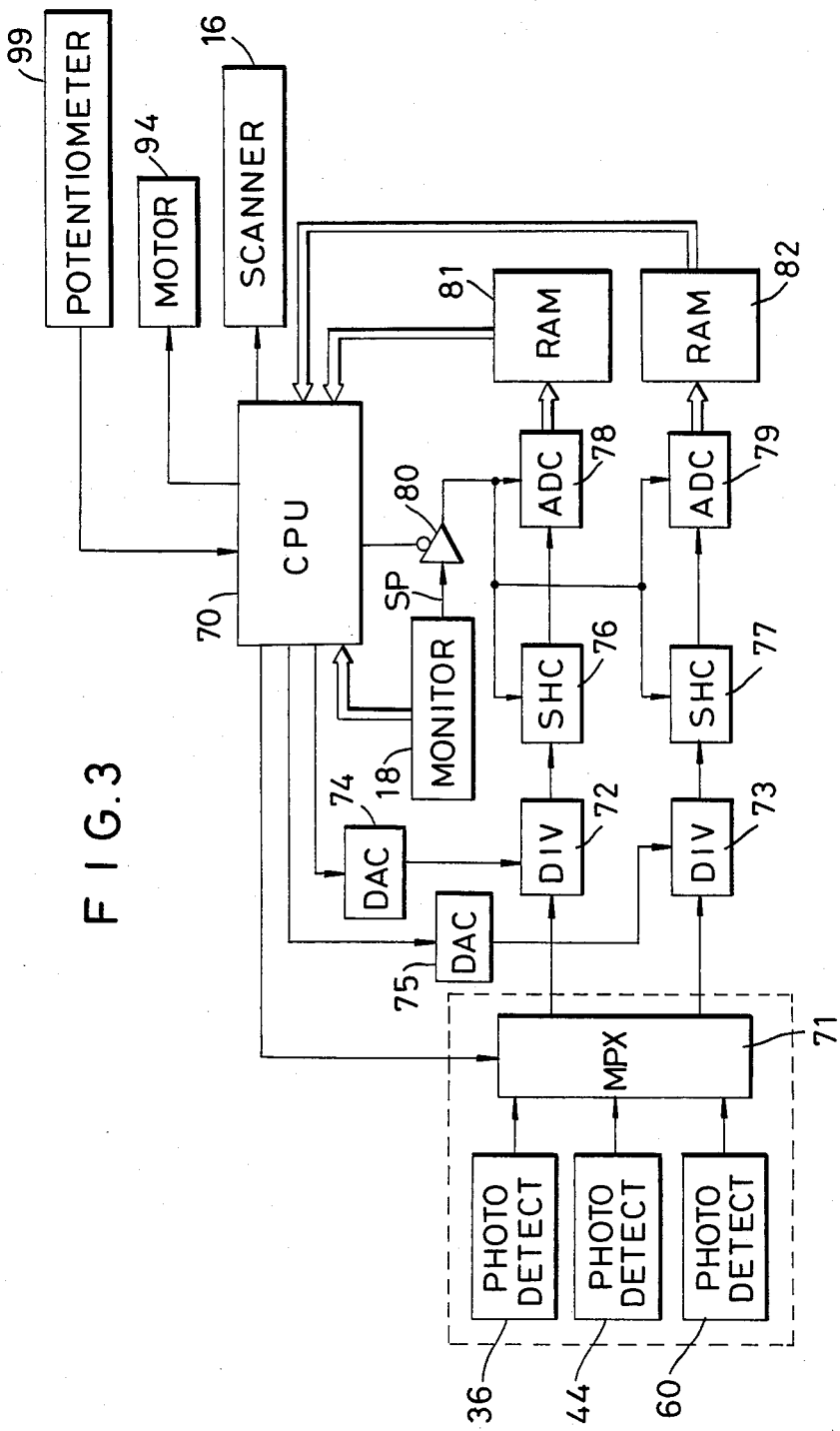
FIG. 3 is a circuit block diagram showing the electric component parts in the embodiment of FIG. 1.

FIG. 3 shows an example of a processing circuit for processing the photoelectric signals from the photodetectors 36, 44 and 60 receiving the three kinds of light information. The operation of the apparatus as a whole and the signal processing are collectively controlled by a computing unit (hereinafter referred to as a CPU) 70 comprising a microcomputer, minicomputer or the like.

The photoelectric signals from the photodetectors 36, 44 and 60 are applied to an analog multiplexer circuit or MPX 71 which is responsive to a command from the CPU 70 to select any given two of the input signals. The selected two photoelectric signals are respectively applied as numerators to dividers or DIVs 72 and 73. Also, aplied as denominators to the DIVs 72 and 73, respectively, are the output signals of digital-to-analog converters or DACs 74 and 75 which are each adapted to convert a digital command value from the CPU 70 to an analog signal. Thus, each of the two photoelectric signals is subjected to a gain control so as to attain the optimum level.

The photoelectric signals from the DIVs 72 and 73 are respectively applied to sample-and-hold circuits or SHCs 76 and 77 and are then applied to analog-to-digital converters or ADCs 78 and 79. The sampling operation of the SHCs 76 and 77 and the converting operation of the ADCs 78 and 79 are performed in response to a time-sequential pulse signal SP generated from the scanning movement monitor 18 for every unit scanning movement. In other words, in response to each unit movement (e.g., 0.01 μm) of the beam spot on the wafer W, the magnitudes of the photoelectric signals are sampled and converted to digital values. In this case, the pulse signal SP is applied to the SHCs 76 and 77 and the ADCs 78 and 79 through a gate circuit 80 which is opened and closed in response to a command from the CPU 70.

The digital values of the photoelectric signals converted by the ADCs 78 and 79 are respectively stored in the order of addresses in random access memories or RAMs 81 and 82. The accessible addresses of the RAMs 81 and 82 are successively updated in response to each pulse signal SP and the waveforms of the photoelectric signals corresponding to the scanning position are stored in the RAMs 81 and 82 as disclosed, for example, in the "Method and Apparatus for Detecting an Edge Position of a Pattern" U.S. patent application Ser. No. 593,870 filed in on Mar. 27, 1984.

The waveform data stored in the RAMs 81 and 82 in this way are then read into the CPU 70 so that various operations are performed on the waveform data and the position of the pattern, the position of the edge, are detected. One method for such detection is disclosed in detail in the specification of the above-mentioned U.S. application and will not be described. Also, the CPU 70 controls the operation of the scanner 16 as well as the operation of the drive motor 94 of the parallel plane glass 90 which is responsive to the potentiometer 99.

Figure 4:
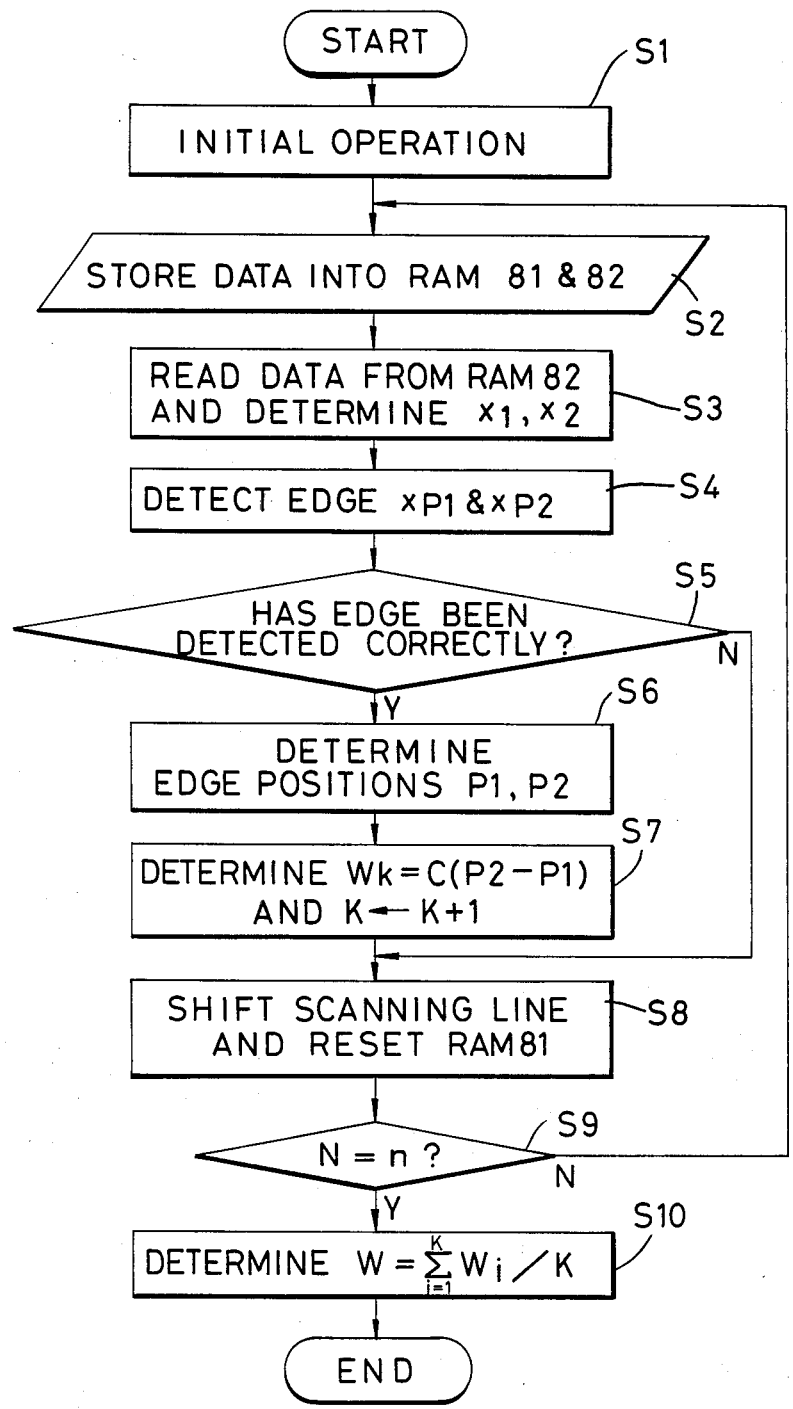
FIG. 4 is a flow chart showing an example of a pattern detecting algorithm.
Figure 5:
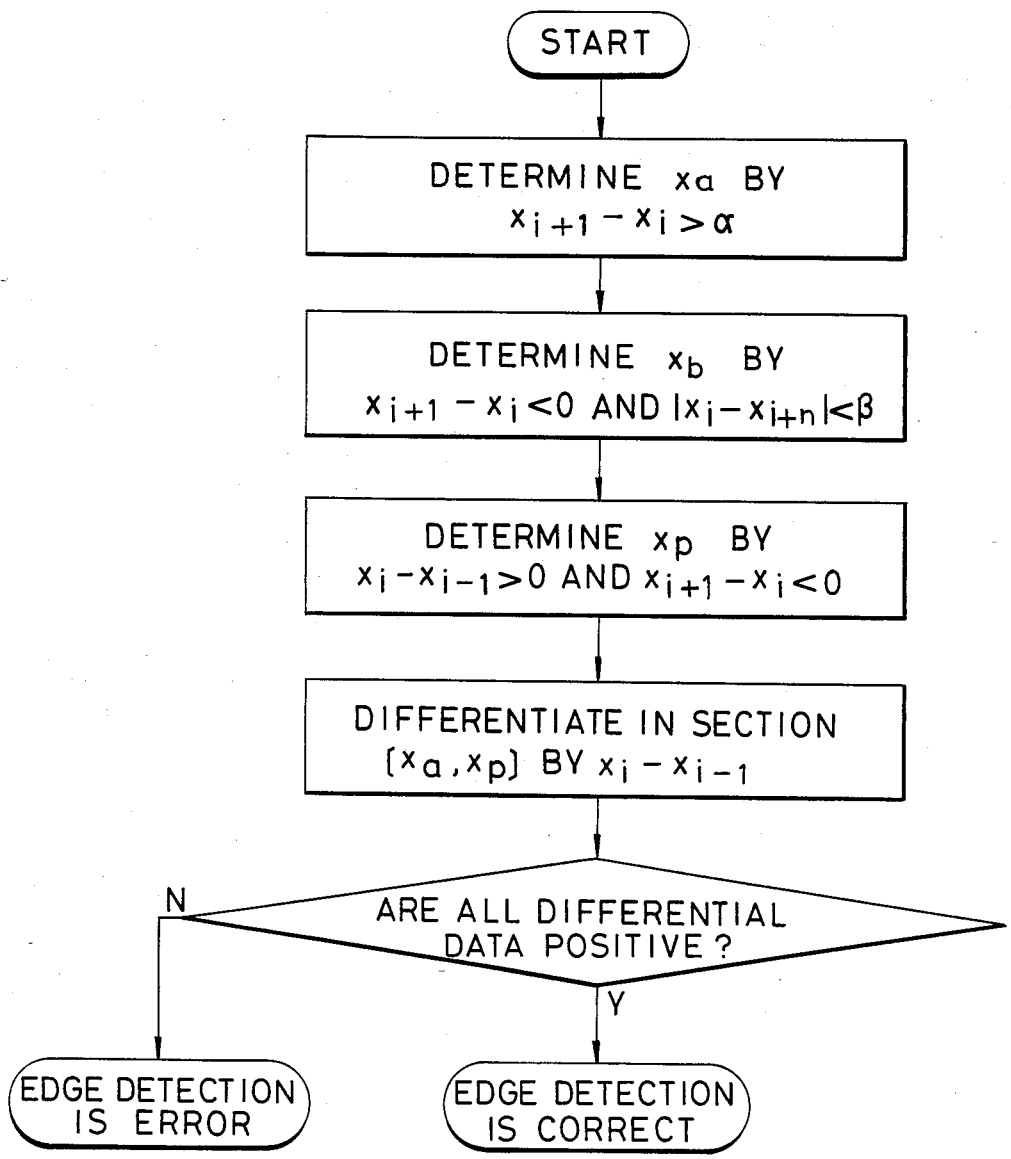
FIG. 5 is a flow chart showing an example of an algorithm for determining an edge detection error.

The overall operation of this embodiment will now be described. FIG. 4 shows an example of a detection algorithm in the form of a flow chart and FIG. 5 shows, in the form of a flow chart, an example of an algorithm for determining whether the edge has been detected correctly.

Firstly, the mirror 54 is moved to the observation position and the position of the sample carrier 28 is adjusted in such a manner that the desired pattern, e.g., linear pattern (raised form), on the wafer W is positioned centrally in the observation field of view. Then, the rotation position of the image rotator 22 is adjusted in such a manner that the scanning path of the beam spot crosses the linear pattern at right angles.

Then, the scanner 16 is moved to position the beam spot so as to laterally align with the linear pattern. At this time, the CPU 70 reads and store as a scan starting point the data corresponding to the position of the beam spot on the wafer W from the scanning movement monitor 18.

Then, the CPU 70 applies to the MPX circuit 71 a command for determining which of the photoelectric signals are to be used in accordance with the shape and material of the pattern to be measured. For this purpose, the CPU 70 has a function of receiving the necessary data on the material, etc., from the outside (the operator). For example, if the material of the pattern is a metal (e.g., aluminum), the scattering or the regular reflection should preferably be used for measurement. If the material is the photoresist, while the measurement can be made by using either of them, by using particularly the fluorescence and one or the other of the scattering and the regular reflection for measurement, it is possible to considerably improve the accuracy of measurement.

For purposes of the description to follow, it is assumed that the line width of a linear pattern in the photoresist is measured by the use of a regular reflection and fluorescence. Thus, the CPU 70 controls the MPX circuit 71 so that the photoelectric signals from the photodetectors 44 and 60 are respectively applied to the DIVs 72 and 73.

Then, the CPU 70 opens the gate circuit 80 and the scanner 16 is operated, causing the movement of the beam spot from the scan starting point until it crosses the linear pattern. At this time, the parallel plane glass 90 is held in a suitable position.

When this occurs, waveform data as shown in FIGS. 6A and 6B, respectively, are stored in the RAMs 81 and 82, respectively. In this case, let it be assumed that in addition to the linear photoresist pattern PP to be measured, a pattern PM of polysilicon or metal is formed on the scanning path of the laser spot as shown in FIGS. 7A and 7B. At this time, of the patterns on the wafer W only the photoresist layer (organic material) emits fluorescence so that it is possible to identify the linear pattern PP by examining a high-intensity portion of waveform data resulting from the fluorescence.

When the laser spot LS scans the patterns PM and PP in an x direction as shown in FIG. 7A, peaks and bottoms corresponding to the variations at the edges of the patterns PM and PP appear, as shown in FIG. 6A, in the waveform of the photoelectric signal caused by the regular reflection and stored in the RAM 81. On the other hand, as shown in FIG. 6B, level changes consisting of simple rise and fall due to the pattern PP alone appear in the waveform of the photoelectric signal caused by the fluorescence and stored in RAM 82. While, in the case of the photoresist pattern, the measurement of the line width around the bottom portions of the pattern is important, the signal waveform produced by the fluorescence faithfully represents the cross-sectional structure of the photoresist pattern shown in FIG. 7B and therefore by setting a slice level $V_s$ slightly higher than the background noise of the signal waveform and sufficiently lower than the peak value as shown in FIG. 6B, it is possible to accurately determine the bottom portions $x_1$ and $x_2$ of the stepped edges at the ends of the pattern PP.

Then, after performing the initial operation of selecting the photoelectric signals, starting the scanning by the laser beam spot and initializing the parameter (e.g., the number of times N of scanning by the laser spot), the CPU 70 reads in the signal waveform data as shown in FIG. 6B from the RAM 82 and compares it with the slice level $V_s$, thereby detecting the positons $x_1$ and $x_2$. The positions $x_1$ and $x_2$ are detected in accordance with the numbers of addresses from the address $AD_o$ of the RAM 82 corresponding to the position $x_o$ of the scan starting point up to the addresses $AD_1$ and $AD_2$ corresponding to the positions $x_1$ and $x_2$, respectively, and the unit scanning movement (e.g., 0.01 μm). Where only the line width measurement by the use of the fluorescence is required, however, it is only necessary to obtain the product of the number of addresses between the addresses $AD_1$ and $AD_2$ and the unit scanning movement without determining the positions $x_1$ and $x_2$.

After the positions $x_1$ and $x_2$ have been determined, the CPU 70 selects the section $L_o$ corresponding to the positions $x_1$ and $x_2$ in the waveform data resulting from the regular reflection and stored in the RAM 81 and the stepped edge positions of the pattern or the interval between the edges is detected on the basis of the waveform in the section $L_o$ (or at around its ends).

With the above-mentioned steps, the edges are generally detected correctly. However, there are cases where the edges are not detected correctly for the reasons which will be described hereunder.

Figure 11A:
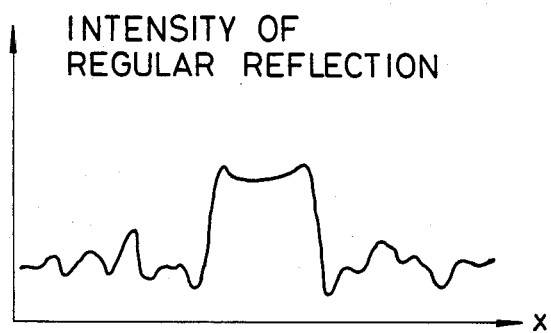
FIGS. 11A, 11B and 11C are diagrams showing exemplary signal waveforms of the regular reflection and fluorescence.
Figure 11B:
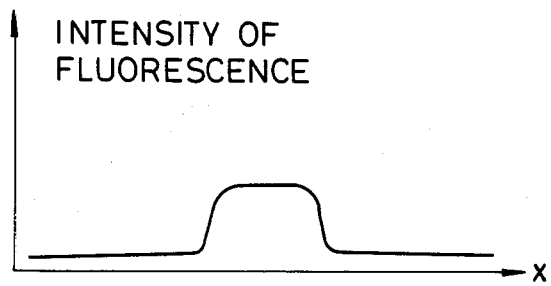

In the case of a signal waveform resulting from the reflection from the photoresist on the aluminum (Al) or polycrystalline silicon (Si) substrate, as mentioned previously, there is the danger of large noise being contained in the waveform as shown in FIG. 11A due to the inherent material characteristic called granulation. Also, as mentioned previously, a signal waveform of the fluorescence takes the form of a simple waveform as shown in FIG. 11B. Thus, approximate positions of the pattern edges may first be determined from the fluorescence photoelectric signal shown in FIG. 11B so that in accordance with the thus determined positions, the exact edge positions are calculated from the reflection photoelectric signal shown in FIG. 11A.

Figure 11C:
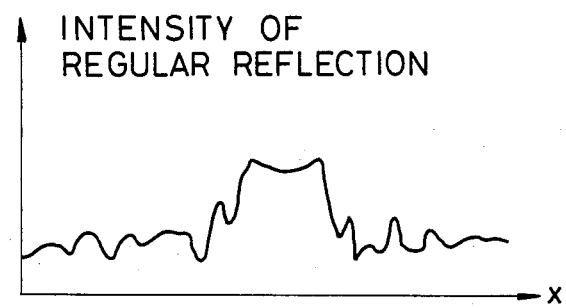

If the granulation overlaps the edge positions of the pattern, however, noise is superposed on the reflection signal waveform corresponding to around the edges as shown in FIG. 11C, thus making the detection of the edge positions impossible.

Therefore, after the above-mentioned steps, whether the edges have been detected correctly is determined in accordance with the flow chart shown in FIG. 5.

Firstly, the data stored in the RAM 81 is sequentially processed to determine a rise starting position $x_a$. For example, the position $x_a$ is represented by a point $x_i$ that gives $x_{i+1} - x_i > \alpha$ (where $\alpha$ is a sufficiently large value).

Then, a rise end position $x_b$ is determined. For example, the position $x_b$ is represented by a point $x_i$ that gives $x_{i+1} - x_i < 0$ and $|x_i - x_{i+n}| < \beta$ (where n is 5 or over and $\beta$ is a sufficiently small value).

Figure 8:
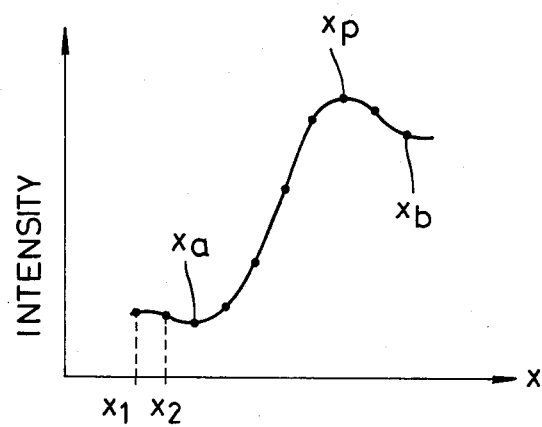
FIG. 8 is a diagram useful for explaining an error detecting procedure.

Then, the peak point $x_p$ immediately preceding the point $x_b$ is determined. For instance, the peak point $x_p$ is represented by a point $x_i$ that gives $x_i - x_{i-1} > 0$ and $x_{i+1} - x_i < 0$. These positions $x_a$, $x_b$ and $x_p$ are shown in FIG. 8 by way of example.

Figure 9:
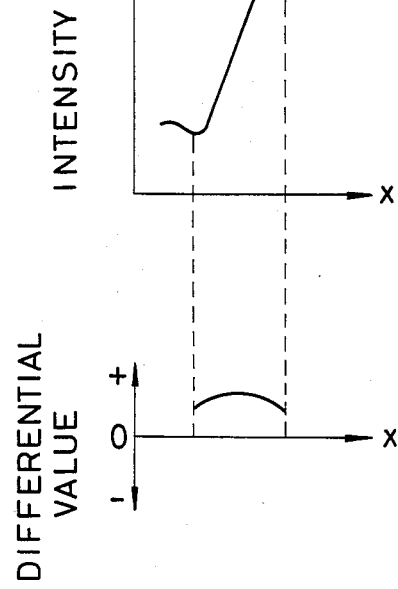
FIGS. 9 and 10 are diagrams showing examples of error determinations.
Figure 10:
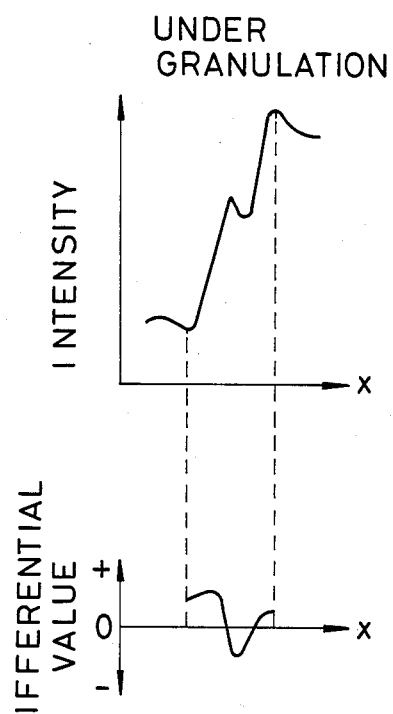

Then, a processing section $(x_a, x_p)$ is selected and all the data in this section are differentiated. More specifically, the value of $x_i - x_{i-1}$ is determined. Then, a decision is made as to whether all the differential data are positive, thereby determining whether the edge detection is not correct. For instance, if there is no effect of the granulation on the waveform of the edge portion, the signal waveform of the reflection becomes as shown in FIG. 9. Thus, its differential value becomes positive, showing that the edge detection has been effected correctly. On the other hand, if there is any effect of the granulation so that the signal waveform of the reflection becomes as shown in FIG. 10, the differential data are not positive altogether and thus the edge detection is not correct.

In the case of the reflection waveform shown in FIG. 11A, the edge detection is effected correctly and the edge positions $P_1$ and $P_2$ are determined. Then, using a given coefficient C, the pattern line width $W_k = C(P_2 - P_1)$ is determined and also the count of the number K of scanning operations with correct edge detection is set to K+1.

If there is any effect of the granulation on the reflection so that its signal waveform becomes as shown in FIG. 11C, as explained in connection with FIG. 5, it is determined that the edge detection is not correct and the operations of the steps S6 and S7 in FIG. 4 are skipped.

Figure 12:
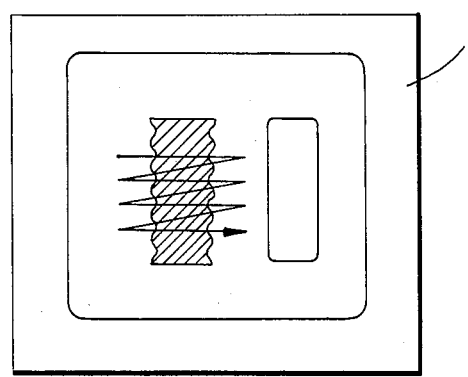
FIG. 12 is a schematic diagram showing a scanning line on the wafer.

Then, the CPU 70 operates the pulse motor 94 so that the parallel plane glass 90 is rotated a given amount. When this occurs, as shown by the arrow in FIG. 12, the spot of laser beam is shifted in a direction perpendicular to the scanning direction and the scanning by the spot is effected at a different position. At this time, the RAM 81 is reset and the signal data resulting from the reflection from the shifted scanning line are newly stored.

Then, the edge detection is effected again and the processing (the steps $S_2$ to $S_8$) of determining the line width of the pattern and shifting the scanning line is repeated n times. After the scanning has been repeated n times, an average value $$W = \sum_{i=1}^{K} W_i / K$$

of the data for K correct measurements is determined and it is used as a line width value. The measurement is effected by thus eliminating the effect of the granulation on the pattern, that is, by effecting the edge detection only in such condition where the signal waveform of the reflection is as shown in FIG. 11A and also averaging the small variations of the edge positions.

By so doing, there is the effect of avoiding the effect of granulation, preventing the same portion from being scanned two or more times thus preventing any degeneration of the photoresist due to the high energy of the laser beam and averaging, if any, the small variations of the edge positions, thereby effecting the line width measurement stably with a high degree of reproducibility.

Where the scattered light is used in place of the regular reflection, it is only necessary to select the waveform of the photoelectric signal from the photodetector 36 through the MPX circuit 71 and store it in the RAM 81. Also, while in FIG. 5 the error detection is effected only with respect to the rise portion of the signal waveform, the same applies to the case of the fall portion.

Figure 13:
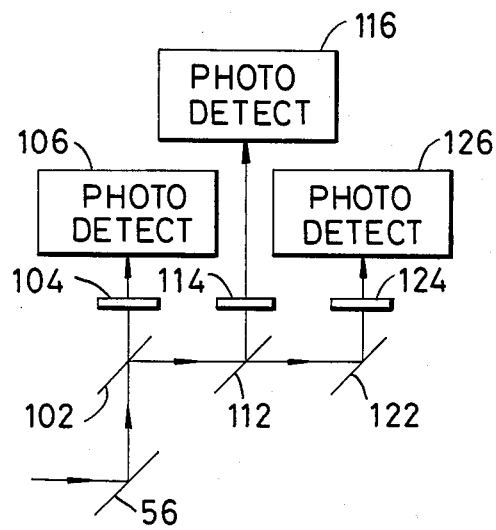
FIG. 13 is a schematic diagram showing the fluorescence detecting system of an apparatus according to a second embodiment of the invention.

A second embodiment of the invention will now be described with reference to FIGS. 13 and 14.

The fluorescence from the mirror 56 shown in FIG. 1 is divided into two parts by a beam splitter 102 so that the transmitted fluorescence is separated by an optical band-pass filter 104 and then supplied to a photodetector 106. On the other hand, the fluorescence reflected by the beam splitter 102 is divided into two parts by the following beam splitter 112 so that the reflected fluorescence is separated by a band-pass filter 114 and then supplied to a photodetector 116. The transmitted fluorescence from the beam splitter 112 is reflected by a mirror 122, separated by a band-pass filter 124 and then supplied to a photodetector 126. It is to be noted that the mirror 122, the band-pass filter 124 and the photodetector 126 may be eliminated as occasion demands.

The band-pass filters 104, 114 and 124 have different wavelength ranges from one another and they are provided to separate the incident fluorescence into two or three ranges. This is done for the purpose of separating the fluorescence emitted from the wafer into one emitted by the photoresist and another emitted by any other substance, e.g., dust or defect, and detecting them separately. For example, where a He-Cd laser having a wavelength of 325 nm is used, the fluorescence emitted from the photoresist can be detected by the band-pass filter 104 of 550 to 650 nm and the fluorescence emitted by dust can be detected by the band-pass filter 114 of 400 to 500 nm. Also, if all kinds of fluorescence are to be detected, the wavelength range of the band-pass filter 124 is selected from 400 to 750 nm. Further, if any other fluorescent material is present, the desired separation can be effected according to its wavelength.

By so doing, only the fluorescence from the photoresist can be positively detected so that if the measurement is effected by the use of the scattered light or the regular reflection, the pattern to be measured can be detected in distinction from the dust even if the scattered light intensity or the regular reflection intensity is varied. Thus, when the fluorescence from any dust is detected during the measurement, the measurement is made void so that the sample carrier 28 may be moved or the spot of laser beam may be shifted in a direction tending to cross the scanning line, thereby effecting again the measurement at a place where no dust is present.

Figure 14:
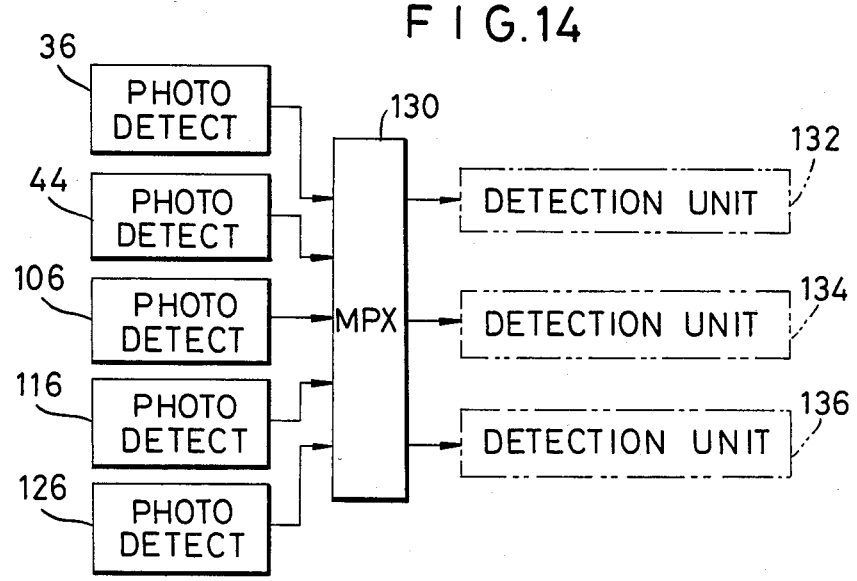
FIG. 14 is a circuit block diagram showing the construction of the signal processing section in the embodiment of FIG. 13.

As shown in FIG. 14, the photoelectric signals from the photodetectors 106, 116 and 126 are applied, along with the photoelectric signals from the photodetectors 36 and 44, to an analog multiplexer (MPX) circuit 130. The MPX circuit 130 selects any given three f the five photoelectric signals and the signals are respectively applied to signal waveform detection units 132, 134 and 136 each including a divider, a sample-and-hold circuit, an A/D converter and a RAM.

The MPX circuit 130 is responsive to a command from the CPU 70 to determine which photoelectric signals are to be selected. For example, the unit 132 stores the signal waveform produced by the regular reflection and the unit 134 stores the signal waveform produced by the scattered light. Also, the unit 136 stores the signal waveform produced by the fluorescence from the photoresist. Thus, by examining the signal waveforms in the units 132 and 134 on the basis of the signal waveform in the unit 136, it is possible to effect the detection of pattern edge positions, line width, dimensions, etc. in a more diversified manner. Also, by storing the respective separated fluorescence signal waveforms in the units 132, 134 and 136, respectively, it is possible to effect detection of the photoresist, detection of the deposition of dust and detection of the presence of any other organic material, etc. It is to be noted that while the fluorescence emitted from the wafer is divided into three ranges, the number of ranges may be reduced to 1 or may be increased to 4 as the occasion demands. Also, the number of signal waveform detection units need not be 3 and the number may be 2.

While some embodiments of the invention have been described hereinabove, the invention is applicable to any apparatus of the type which requires the position detection of a pattern made of any material which emits fluorescence. For example, the invention can be applied to the detection of alignment marks in exposure apparatus used in the fabrication of semiconductor devices. Further, instead of scanning by the laser spot as in the illustrated embodiments, the sample carrier 28 may be adapted to be moved so that all the same effect can be obtained by replacing the scanning movement monitor 18 with an optical interference measuring device which detects the position or the amount of movement of the sample carrier 28. Further, while the laser spot has been described as circular, it may also take the form of a long and narrow beam spot elongated in parallel to the stepped edge. In this case, a smoothing effect for irregularity of the edges can be expected.

Still further, while, in the above embodiments, the scanning position of the laser is shifted when the edge detection is effected correctly as well as when the detection is not effected due to the effect of granulation or the like, where there is no danger of causing any ill effect on the results of measurement even if the same area is scanned repeatedly, the scanning position may be shifted only when the edge detection is not effected correctly so that when the detection is effected correctly, the shifting is stopped and immediately the scanning is performed a plurality of times, thereby obtaining the measurement data. In this case, the time required for the measurement can be reduced correspondingly.

Still further, where an object to be measured is not fluorescent, making it impossible to utilize any fluorescence signal, or where the measurement data of the desired accuracy can be obtained without using any fluorescence signal, the fluorescence detecting system is not required and the measurement is effected by the use of the reflection or scattering detecting system. Also, in such case, the shifting effected upon failure of the correct edge detection due to the effect of granulation or the like is still effective.

We claim:

1. An apparatus for detecting a position of a photoresist pattern formed on a surface of a substrate, said apparatus comprising:

means for radiating an energy beam and forming a tiny spot of said energy beam on the surface of said substrate;

means for displacing said substrate and said energy beam relative to each other and scanning the surface of said substrate with said tiny spot along a scanning line;

first detecting means for receiving at least one of a reflection and scattering of said energy beam from said surface of said substrate and generating a first output representing the position of edges of said pattern intersecting said scanning line;

second detecting means for receiving a luminescence emitted by said surface of said substrate in response to said energy beam and generating a second output representing the position of said photoresist pattern on said scanning line; and means for determining the position of edges of said pattern in accordance with the comparison between said first output and said second output.

2. An apparatus according to claim 1, wherein said first detecting means includes a first detection unit for receiving the reflection of said energy beam to generate an output corresponding thereto and a second detection unit for receiving the scattering of said energy beam to generate an output corresponding thereto.

3. An apparatus according to claim 2, wherein said determining means includes means for selecting at least one of the outputs of said first and second detection units and the output of said second detecting means whereby the position of said pattern is determined in accordance with the comparison between said selected outputs of said first and second detection units and said output of said second detecting means.

4. An apparatus according to claim 1, wherein said second detecting means receives a fluorescence emitted from said pattern photoresist where said tiny spot is formed and generates an output corresponding thereto.

5. An apparatus according to claim 1, wherein said determining means includes means for storing data corresponding to the first output and the second output, respectively, in correspondence to the relative position of said tiny spot whereby the position of said photoresist pattern is determined in accordance with said data.

6. An apparatus according to claim 1, wherein said scanning means scans the surface of said substrate with said tiny spot along a scanning line extended in a first direction, and wherein said apparatus further comprises means for shifting the position of said tiny spot on the surface of said substrate in a second direction perpendicular to said first direction.

7. An apparatus according to claim 6, wherein said scanning means is responsive to said shifting means to scan the surface of said substrate with said tiny spot a plurality of times along scanning lines different from each other, and wherein said determining means averages positions of said pattern determined by said plurality of times of scanning performed.

* * * * *